United States Patent [19]

Lowe et al.

[11] Patent Number: 5,148,355
[45] Date of Patent: Sep. 15, 1992

[54] METHOD FOR MAKING PRINTED CIRCUITS

[75] Inventors: John M. Lowe, Leicester; Joseph Devonport, Leicestershire, both of United Kingdom

[73] Assignee: Technology Applications Company Limited, Isle of Man, Isle of Man

[21] Appl. No.: 585,070
[22] PCT Filed: Dec. 22, 1989
[86] PCT No.: PCT/GB89/01536
§ 371 Date: Oct. 22, 1990
§ 102(e) Date: Oct. 22, 1990
[87] PCT Pub. No.: WO90/07858
PCT Pub. Date: Jul. 12, 1990

[30] Foreign Application Priority Data

Dec. 24, 1988 [GB] United Kingdom ............... 8830251
Dec. 18, 1989 [GB] United Kingdom ............... 8928563

[51] Int. Cl.$^5$ ............................ H05K 1/04; C23C 3/02
[52] U.S. Cl. .................................. 361/410; 174/68.5; 428/546
[58] Field of Search ............... 361/311, 312, 313, 323, 361/306, 321, 410; 174/52 FP, 52 PE, 68.5; 357/74, 81, 51; 428/546; 101/466

[56] References Cited

U.S. PATENT DOCUMENTS

| | | | |
|---|---|---|---|
| 3,644,661 | 2/1972 | Asar et al. | 174/68.5 |
| 4,141,055 | 2/1979 | Berry et al. | 361/410 |
| 4,245,555 | 1/1981 | Alston | 101/466 |
| 4,522,888 | 6/1985 | Eichelberger et al. | 428/546 |
| 4,800,397 | 1/1989 | A-Ardakani et al. | 346/76 PH |
| 4,859,807 | 8/1989 | Swiggett et al. | 174/68.5 |
| 4,921,623 | 5/1990 | Yamaguchi et al. | 252/512 |

Primary Examiner—Donald A. Griffin
Attorney, Agent, or Firm—Jones, Day, Reavis & Pogue

[57] ABSTRACT

Printed circuits are produced by screen printing or the like to deposit conductors, resistors, capacitors and insulators. Crossover connections are made by covering the conducting portions to be crossed with an insulating material that serves as a base for a printed crossing conductor. The equivalent of multilayer boards can be achieved by printing repeated layers of conductors, components and insulators on the same side of the board, or by printing on two sides of a board. Interconnection between adjacent layers can be made as a part of the printing process. A method of making a printed circuit board comprises applying a first and second coating in a desired pattern to a substrate, the substrate (12) being disposed in a different relationship to coating apparatus used in applying a second coating from the relationship in which it is disposed in applying the first coating. Preferably a number of identical boards are printed on a substrate (12) from which they are subsequently separated. The individual boards are positioned such that the same pattern may be applied when the substrate (12) is presented to coating means in any of a number of orientations each separated from the next by a fixed angle of rotation about an axis (A) at right angles to the substrate (12), the first coating being applied in one such orientation and the second after the screen and substrate respectively have been rotated in opposite direction, (S,B) each through 90°.

12 Claims, 1 Drawing Sheet

METHOD FOR MAKING PRINTED CIRCUITS

BACKGROUND OF THE INVENTION

This invention is related to printed circuits for use in electrical and electronic equipment. In particular, it is an improved method of making printed-circuit boards and of producing printed circuits on surfaces other than conventional printed-circuit boards. This invention is also concerned with making printed circuits and is especially concerned with a method of making a printed circuit in which a layer is applied in a desired pattern to a substrate.

An element that is common to almost all electronic equipment is the printed circuit, typically in the form of a printed-circuit board (PCB). A PCB is generally made by laminating copper foil to a board. A desired pattern that includes conductors in the plane of at least one surface of the board is placed upon the board, and holes are drilled or punched for the mounting of components. This pattern is typically realized by placing a photosensitive resist on the board, exposing a photograph of the desired pattern on the resist, and developing the resist to produce a protective coating over the pattern. The remainder of the resist is treated to remove undeveloped resist from portions where it is desired to remove the copper. The board is then treated with a process that removes the exposed copper. When the remaining resist is then removed, the desired pattern remains in the copper. Mounting holes for components are drilled or punched at desired locations somewhere in the course of this process, either before or after the removal step.

The materials most commonly used for PCBs are either polymerized epoxy materials containing glass fibers or paper bound by impregnated synthetic resins such as phenolic materials. The latter group is often referred to generically as synthetic-resin-bonded paper (SRBP). Boards made of either of these types of materials are clad with copper on one side or both sides, with the heat and pressure of the cladding or laminating process helping to cure the resin. The material cost of an SRBP PCB is typically about half as much as that of an epoxy fiberglass board of the same surface area, so there is a potential cost advantage when the SRBP board can be used. There are various bases for the selection between epoxy fiberglass and SRBP material. For example, the epoxy fiberglass boards are generally higher in strength and are preferred for use in equipment that may be subject to vibration.

A particular problem of circuit design that leads to complication in PCBs is the fact that not all electronic circuits can be made with their connections in a single plane. It is sometimes necessary to make bridging connections between different portions of a circuit. A considerable amount of ingenuity goes into the design and layout of PCBs to minimize such bridging connections. However, sometimes it is impossible to avoid them. In such a case, it is possible to solder jumper wires between the portions of the circuit that are to be connected. This is especially undesirable for long runs, and it is better avoided even for short runs. A better solution is to use PCBs that have more than one conducting layer. The simplest of these is a two-sided PCB. This is a board that has copper laminated to both sides. Separate patterns are etched on the two sides to effect the desired circuit layout and cross-connections. However, in order to make such cross-connections, and to complete the connection between the two sides of the board, it is normally necessary to use epoxy fiberglass because of the necessity of plating holes through the board to connect the top layer to the bottom layer. Holes that are drilled in an SRBP board are adequate to support the leads of components that are placed in the board for soldering, but they are not normally clean enough when drilled or punched to permit satisfactory electroplating of connections between layers of the board. There is thus a long-felt need in the PCB industry for a way of making PCBs with crossover connections on single-sided SRBP boards without using soldered jumper wires.

The same considerations apply equally as much to boards having more than two layers. These boards, referred to as multilayer boards, are often used in more complicated circuits where one set of bridging connections is not enough. As with the two-sided board, it is normally necessary to use epoxy fiberglass for such PCBs. It can be seen that the result of a need for crossed connections in the typical etched copper PCB leads to an increased cost because of the need for epoxy fiberglass in the PCB instead of the less-expensive SRBP boards.

The problems just described become extreme in the case of PCBs for keyboards. A keyboard for a typewriter, computer or the like typically generates an electrical signal when a key is depressed to make an electrical contact or an inductive or capacitive coupling. Such a coupling is made directly or indirectly between two separated conductors on the board or on a flexible plastic membrane that is spaced apart from the board and makes a conductive or field contact when pressed toward the board. When the keyboard is the typical typewriter or computer keyboard, it is impossible or nearly impossible to avoid crossed connections. The physical size of the hands of an operator also sets a limit to the minimum size of a PCB for a keyboard, since it is necessary to place a keyboard switch on the PCB at a location directly beneath the key to be depressed. As a result, the typical PCB for a keyboard is of the order of ten to eighteen inches by four to seven inches (25–45 cm. by 10–18 cm.) This size requirement has caused the PCB to become a significant part of the cost of a typewriter or computer keyboard. It is not normally possible to use an SRBP PCB because of the need for crossovers and the attendant plated connecting holes. The result is a relatively expensive epoxy fiberglass PCB, laminated and etched on both sides. This cost could be greatly reduced if it were possible to use an SRBP board that contained a circuit on only one side.

A second problem in the manufacture of PCBs for keyboards is the fact that keyboards either have pairs of exposed electrical conductors that are bridged by another conductor or coupled capacitively or inductively to make an electrical connection when a key is depressed, or else have flexible membranes that couple to the board when pressed. It is necessary to apply some form of protection to the exposed electrical conductor so as to minimize the buildup of corrosion that would interfere with the making of the electrical connection. This is most commonly done by etching a copper pattern of interlaced combs, parallel conductors or the like and plating gold to the combs to provide a contact surface that is conductive electrically and that is not readily corroded by exposure to the atmosphere. Gold may be plated to the copper either by electroplating or by electroless plating. Either of these represents an additional element that contributes to the cost of preparing a PCB for a keyboard.

The usual intended use of a PCB is to serve as a mount for components such as resistors, capacitors, diodes and transistors. Any of these components is typically inserted by placing its leads into holes in the PCB which is then passed through a wave-soldering process to attach the components physically and electrically to the PCB. During the process of manufacturing the PCB, the board is typically coated in part with an organic polymer solder resist to prevent solder from adhering to the covered regions. If the PCB is one designed for a keyboard, the resist is typically deposited so as to cover conductors on the keyboard surface but is masked to leave the comb or other keyboard switches exposed for operation.

A use that is analogous to that o f PCBs is the manufacture of electrical cables or the like by depositing conducting material on flexible plastics such as mylar. This is often done by some form of printing process such as screen printing . Most, if not all, of the materials, typically plastics, that are used for flexible cables or flexible flat conductors are not adapted for wave-soldering, and it is therefore necessary to make compression connections or the like at the ends of the cable or flat conductor. As a result, there is no way to attach resistors or capacitors to flexible material, and a rigid PCB is therefore used with the flexible material to serve as a component mount.

SUMMARY OF THE INVENTION

It is an object of the present invention to provide an alternative method of making electrical interconnections.

It is a further object of the present invention to provide a better way of making printed circuits.

It is a further object of the present invention to provide a better way of making printed-circuit boards.

It is a further object of the present invention to provide a method of making crossed electrical connections on a single side of printed-circuit board.

It is a further object of the present invention to provide a method of producing resistors by a printing process on the printed-circuit board.

It is a further object of the present invention to provide a method of producing capacitors by a printing process on a printed-circuit board.

It is a further object of the present invention to provide a method of producing a printed circuit on a flexible substrate.

It is a further object of the present invention to produce a printed circuit including resistors and capacitors on a substantially planar solid surface.

It is a further object of the present invention to produce a printed circuit including resistors and capacitors on a curved surface.

It is a further object of the present invention to enable the use of synthetic-resin-bonded paper printed-circuit boards by effecting multilayer printing on one side of the board. Other objects will become apparent in the course of a detailed description of the invention.

Printed circuits are produced by screen printing or the like to deposit conductors, resistors, capacitors and insulators. Crossover connections are made by covering the conducting portions to be crossed with an insulating material that serves as a base for a printed crossing conductor. Exposed conductors, as for keyboards and compression connections, are protected from the development of high-resistance corrosion products by printing or overprinting them with an ink that deposits a carbon layer. The method permits the use of rigid printed-circuit boards having crossed connections without requiring the use of a two-sided board. The equivalent of multilayer boards can be achieved by printing repeated layers of conductors, components and insulators on the same side of the board, or by printing on two sides of a board. Interconnection between adjacent layers can be made as a part of the printing process. Resistors can be printed by screening or otherwise depositing a controlled amount of a resistive ink. Capacitors can be produced by printing conductive layers separated by insulating layers. The process may produce printed-circuit boards containing resistors and capacitors without the necessity for inserting and wave-soldering components. If such a board is to contain components in addition to those printed by the process of the present invention, a printed carbon layer can be used as a solder resist to protect printed conductors during the wave-soldering process, and to protect exposed contacts, as for keyboards, during wave-soldering and in use. The process also permits the printing of a conducting layer as a shield against radio-frequency interference or as a ground plane to provide electrical isolation of portions of a circuit from each other.

A method in accordance with the invention permits production of a printed circuit on a flexible substrate. Resistors, capacitors, conductors and insulators may be produced on a substantially planar solid surface or on a curved surface.

DETAILED DESCRIPTION OF THE INVENTION

Figure 1:
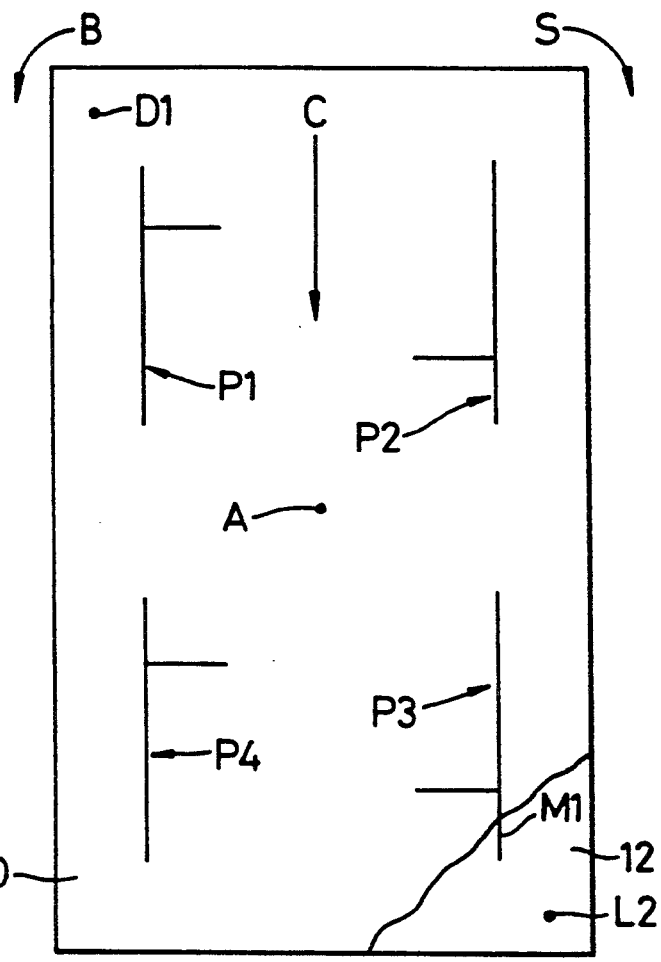
FIG. 1 is a diagrammatic plan view of a screen with a corner broken away revealing a substrate above which the screen is positioned, in a position for applying a first coating.

The examples that follow represent particular applications of the invention. In the case of those applications to keyboards for typewriters or computers or the like, the scale is fixed by the size of the hands of an operator, and the resulting necessity to separate the keys physically. These dimensions fix the size of such a circuit board. Some of the examples relate to conventional printed-circuit boards in which components will be inserted and wave-soldered. The possibility of limiting the printing to one side of a board also makes it possible to print a circuit on any surface on which it can be printed and on any substance that is compatible with the printing process. Thus, the plastic of a car dashboard, the case of a radio, a flexible plastic or paper transfer medium, or a heat sink could be used as a substrate on which to print a circuit according to the present invention. The examples shown here were also produced by a screen printing process, which represents a preferred method, but it is clear that any method of printing that will handle the conducting, resistive, carbon and solder-resist inks will be adaptable for the present process and for products produced by the process. The other possibilities for doing this include transfer printing, lithography, air brush, hand brush, and the like. The examples that included the printing of. resistors and capacitors produced such components having values that were repeatable within tolerance ranges of five to ten per cent. These values are thus comparable to those achieved with ordinary discrete components.

EXAMPLE 1

An SRBP board approximately 14 inches by 4 inches by 1/16 inch contained a laminated layer of copper that had been etched to produce conducting paths and appropriately placed comb connectors to be bridged by conducting pills when a key was depressed. The combs were plated with gold. In order to function properly, this board needed connections that would cross certain conductors without making electrical contact with them. The crossing connections were achieved by screen printing with an ink containing a polymer resist at the crossings. The resist was cured using ultraviolet radiation. A conducting path connecting the desired points was then printed by a screen process over the cured resist, and the printed conductor was then cured at an elevated temperature. This produced a functioning printed-circuit board for a keyboard that was printed on only one side of the PCB and that had no bridging wire connections.

EXAMPLE 2

An SRBP board approximately 14 inches by 7 inches by 1/16 inch had been laminated with copper and the copper had been etched to leave an appropriate pattern of electrical connections for a keyboard. This pattern was placed on a single side of the phenolic board. Each of the contact pads for the keys was formed by a screen printing of a conductive ink. This ink was then cured by heating. The contact pads and also exposed conductors for compression connectors at an edge of the board were then covered by screen printing with an ink containing carbon, and the ink was cured by heating it. A screen printing was then made to apply an insulating polymer resist to all areas of the board except the exposed conductors for the key pads and for compression connections at an edge of the board and at those areas where components were to be inserted and wave-soldered. The cured carbon ink functioned as a solder resist that protected the contact pads from solder during the wave-soldering process. If the board had been subjected to hand soldering, the carbon ink would have protected the contact pads from damage by heat.

EXAMPLE 3

A keyboard of FR-4 epoxy fiberglass having dimensions of approximately 14 inches by 7 inches by 1/16 inch had been laminated and etched on one side to leave copper conductors in a pattern appropriate for a keyboard. Layers of insulating resist were screened in desired crossover patterns on the side of the board that carried the copper and were cured by ultraviolet radiation. A screen printing was then made with a conducting ink to apply conducting strips on the crossovers and also print the contact areas for keys. This was cured by heating. The areas of screened conductors were then subjected to a further screening process to cover the screened conductors with ink containing carbon. This was then cured by heat. The board was then equipped with resistors by screen printing with resistive ink in desired locations. After the printed resistors were cured by heat, a protective layer of solder resist was applied and was then cured by ultraviolet radiation. The solder resist left open areas for the application of solder. Because of the carbon covering, this board could be subjected to flow soldering without damaging the screened connectors and components.

EXAMPLE 4

An SRBP board approximately 1 inch by 2 inches by 1/16 inch had been laminated with copper foil on one side, and the foil was etched to leave a d ®sired circuit pattern. A portion of the board was covered with a screened resist which was then cured by ultraviolet light. A conducting ink was printed by a screen process over the resist to make a conducting crossover. The conducting ink was also placed over an area approximately ¼ inch square to form one plate of a capacitor. The conducting ink was cured by heat. Resistors were deposited in desired locations by screening resistive ink which was then cured by heat. A layer of resist was deposited over the conducting area to provide a dielectric material for the capacitor. This was then cured by exposure to ultraviolet light. A second conducting layer was printed by screening to cover the resist and form the second plate of the capacitor and also to connect the capacitor at a desired point on the copper lamination, and the conducting ink was cured by heating it. The result was a circuit board with connections and components. A protective layer of solder resist was applied with holes for solder points, and the resist was cured by ultraviolet radiation.

EXAMPLE 5

An SRBP board of dimensions approximately 2 inches by 1 inch by 1/16 inch received a screened pattern of conducting ink which was then cured by heat. A pattern of screen resistive inks was placed by a screen printing process in desired locations, and the resistive ink was cured by heat. Selected locations of the screened conductor were then plated with copper in an electroless plating tank. A protective resist was then screened over all but those portions of the board that were to be exposed for contact. This included the areas that were given the copper plate, which readied that region of the board for soldered contact, either manual or automatic soldering. As an alternative, nickel could equally as well have been plated to provide an appropriate soldering surface. The conductors formed by conducting ink will not generally withstand the heat associated with hand soldering, although they may stand up under wave-soldering.

EXAMPLE 6

An SRBP board 14 inches by 7 inches by 1/16 inch was screen-printed with a conducting ink in a pattern appropriate to a keyboard. The ink was cured by heat, and crossing connectors were placed by the process described above. Resistive ink in controlled patterns was printed and cured by heat to produce desired resistors as described above. A layer of solder resist was then screened on the board in a pattern that left substantially square openings at the locations of the typewriter keys. The resist was cured by exposure to ultraviolet light. The cured resist served as a mechanical spacer for a membrane with appropriately placed conductors that was laid over the resist. This provided a method of making a membrane-switched keyboard without the necessity of tooling to cut openings in a piece of plastic to space the membrane from its mating electrical connection. The connections made here were capacitive, but they could equally as well have been conductive or inductive. The process could also have been applied to make switches using two parallel membranes that were spaced apart by screened and cured resist rather than using a rigid board as one connector support.

All of the boards described in the examples above have in common the fact that all of their printing is done on one side of the board. Some boards have been made in the past with jumper wires that are wave-soldered as a part of the process of making the board, but this is seldom a good solution to the problem of bridging connectors and it is often unfeasible if the run of conductors to be bridged is of any length. Another problem that can be overcome much more simply than the present practice is that of providing shielding against radio-frequency interference (RFI shielding). One reason for the use of multilayer boards is to place a shielding layer protecting portions of the circuit. This is done much more simply on a single layer board on one side by depositing and curing a conducting layer over a layer of resist.

The process of the present invention is adaptable to print as many as thirty to fifty layers, one on top of the other. The practical minimum spacing between adjacent conductors is of the order of 0.01 inch. A screened layer after curing can typically be controlled in thickness to plus or minus 5 microns. Capacitors of various values ranging up to 1000 picofarads may be made as described in the examples, with tolerances to 5 per cent.

In some circumstances, pinholes in one of the applied layers may cause problems, especially in an insulation layer where pinholes may cause unintentional and catastrophic connection between conducting layers. In order to reduce the risk of this problem arising, the or each insulating layer may be applied in two stages, so that two coatings are applied with variation of coating direction or slightly positional variation between the coatings. For example, when applying an insulating layer using screen printing the first stage comprises applying a screened coating with the direction of application along the X-axis of the screen and work-piece. The second stage comprises applying a further screened coating with a variation from the original coating, for example either by rotating both the screen and the work-piece through 90°, relative to the coating direction, and/or with the screen offset relative to the work-piece, e.g. in the X and/or Y direction, by a minimal amount e.g. a small part of a millimeter.

The Table is a listing of the inks that were used in a screen printing process to produce the examples above.

TABLE

Screen Printing Process Inks

1. Resist. This is a cross-linking polymer sold under the trademark "Photocoat." The examples used type 2G which is not flexible, although a style 3G is available that is flexible. The examples used a resist that was curable by ultraviolet radiation. A heat-curable resist could equally as well have been used.
2. Resistive Ink. All of the examples used a polymer thick-film ink sold under the trade name "Matthey-Lec" R-4000 series. This is available in a range of resistivities and is cured by heat.
3. Carbon Ink. This is a polymer thick-film ink containing carbon black. It is cured by exposure to heat.
4. Conductive Ink. This is a polymer thick-film ink containing silver flakes. It is cured by exposure to heat.

In the manufacture of printed circuits it is known to apply a number of layers in desired patterns to the surface of a substrate, commonly an insulating board. The layers may be applied in a variety of ways, for example by first applying a sheet of copper material to the board and then etching away unrequired regions to leave a desired pattern or by applying coatings of suitable material to the surface of the board in a desired pattern to achieve the required effect. It is with this latter operation that the invention is concerned. The layers which are applied may be in the form of a conductive material or may be a resist which may be an electrically insulating material and/or a material which resists damage, e.g. by etching fluid or other operations, for example soldering. Solder is non-adherent to most resists and such resists are commonly unaffected by temperatures encountered during soldering.

In some circumstances pinholes in one or more of the applied layers may cause problems, especially in an insulation area where pinholes may cause unintentional and, potentially, catastrophic connection between conducting layers.

It has been found that the risks of pinholes arising may be reduced by applying the, or each, insulating layer in two stages with the substrate disposed in a different relationship to coating apparatus in each stage, so that two coatings are applied with, for example, variation of coating direction or slight positional variation between coatings. This substantially reduces the risk that pinholes will cause a problem.

In one aspect the invention may be considered to provide a method of applying a layers in a desired pattern to a substrate for a printed circuit comprising applying a first coating in the desired pattern to the substrate and applying a second coating in the desired pattern to the substrate, the substrate being disposed in a different relationship to coating apparatus used in applying the second coating from the relationship in which it is disposed to coating apparatus used in applying the first coating.

Preferably, in methods in accordance with the invention the coating apparatus used is a screen printing apparatus. In one methods the relationship of the board to the apparatus is changed by moving the position of the screen of the apparatus relative to the substrate through a very small distance e.g. a small part of the millimeter e.g. 0.05 mm. However, although this technique is satisfactory for some applications, the various conductors and other applied layers of many modern printed circuits are so close to one another that even this very small positional adjustment is unacceptable.

In another method in accordance with the invention which is, in some circumstances, an improvement over the method outlined in the last preceding paragraph, two separate but identical screens each having the same pattern are used. The first coating is applied using one of the screens and then this screen is removed and the other screen positioned in registration with the substrate and the second coating applied. The cost of production of suitable screens is very high and this method requires two screens. From an accuracy point of view the use of more than one screen can lead to added problems, for example distortion of the two screens may differ e.g. if the screens are of slightly different tensions. Thus, while this method using two screens may be preferable to that described in the last preceding paragraph, it is still desirable to achieve further improvements in accuracy for some uses, as well as to avoid the expense of two screens, if possible.

In another preferred method in accordance with the invention where the coating apparatus is a screen printing apparatus, the relationship of the substrate to the apparatus is changed by rotating both the substrate and the screen through an angle, suitably 90°, relative to the coating direction of the apparatus.

In carrying out the preferred method in accordance with the invention, preferably a number of identical circuit patterns are printed on a substrate; the circuit patterns are suitably printed to provide a corresponding number of individual circuit boards which are subsequently separated from the remainder of the substrate. Suitably the substrate is provided by an insulating sheet material on which the circuits are printed and from which the individual circuit boards are severed after printing. In this preferred method the regions to which the desired pattern is to be applied are positioned such that the same pattern may be applied to the substrate when the substrate is presented to a pattern applying portion of the coating apparatus in any of a number of orientations, each separated from the next by a fixed angle of rotation about an axis at right angles to the substrate a centre of the substrate. The first coating is applied with the substrate in one such orientation, the substrate and pattern applying portion are thereafter relatively rotated through said fixed angle (or a multiple thereof other than 360°), and then the second coating is applied. Suitably the fixed angle is 180° and four regions to which a pattern is to be applied are present. By making this change in position of the pattern applying portion relative to the substrate, the second coating is applied to each region using a different pattern applying portion from that used to apply the first coating to the same region; the chance of a damaging pinhole appearing in precisely the same position of two different applying portions is very small.

In the preferred method in accordance with the invention this risk is reduced even further by not only ensuring that the second coating is applied to each region by a different pattern applying portion from the first coating but also that the second coating is applied in a different coating direction. In this preferred method, which uses a screen printing apparatus, the screen and substrate are rotated in opposite directions, each being rotated through an angle of 90°.

There now follows a detailed description to be read with reference to the accompanying drawings of a method of making a printed circuit board embodying the invention. It will be realized this method has been selected for description to illustrate the invention by way of example.

Figure 2:
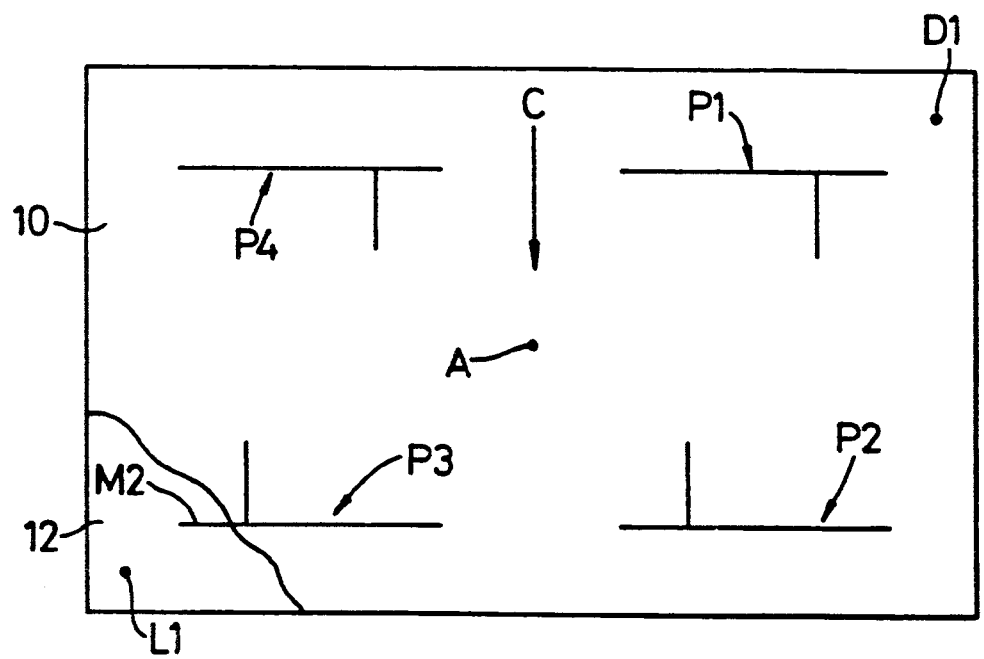
FIG. 2 is a similar plan view showing the screen and substrate in position for applying a second coating.

In the accompanying drawings:

FIG. 1 is a diagrammatic plan view of a screen with a corner broken away revealing a substrate above which the screen is positioned, in a position for applying a first coating; and FIG. 2 is a similar plan view showing the screen and substrate in position for applying a second coating.

A screen 10 of a screen printing apparatus is positioned above a substrate provided by a rigid insulating sheet material 12 in contact with a surface of the sheet material 12, forming a base on which printed circuit boards are to be formed. The screen 10 and sheet material 12 are positioned for the first coating in register with one another as shown in FIG. 1, that is with datums D1 and L1 is alignment and with datums D2 (not shown) and L2 in alignment. In register for the second coating (FIG. 2) the datum D1 overlies the datum L2 whilst the datum D2 overlies datum L1. Desired patterns P1–P4 to be printed are shown in the drawings. The patterns are produced by multiple image photographic techniques and are, therefore, basically identical, although arranged in appropriate positions and orientations to enable the carrying out of the illustrative method.

In carrying out the illustrative method, with the screen 10 positioned relative to the sheet material 12 as shown in FIG. 1, coating means of the screen printing apparatus is moved relative to the screen in a coating direction C to apply a first coating of material direction C to apply a first coating of material, for example a resist, through the screen 10 to deposit the desired pattern P1–P4 onto the base sheet material 12; material M1 deposited on the sheet material 12 is indicated in FIG. 1. After the first coating has been applied, the screen 10 is separated from the sheet material 12 and the screen 10 and sheet material 12 are rotated about an axis A at the centre of the base and perpendicular to the base and to the screen 10. The screen 10 is rotated in the direction indicated by the arrow S in FIG. 1 and the base sheet material 12 is rotated through an angle of 90° as indicated by the arrows A, B about the axis A until they occupy the positions in which they are shown in FIG. 2. The screen 10 and sheet material 12 are put into register by ensuring that the datums are appropriately aligned. In this instance, however, the datum D1 is aligned with the datum L2 whilst the datum D2 (not shown) is aligned with the datum L1 (see FIG. 2). After the screen 10 and sheet material 12 have been moved into register, they are again moved into contact with one another and a second coating is applied by moving the coating means (e.g. a squeegee) in the coating direction indicated by the arrow C in FIG. 2. The second coating is applied over the first coating but the second coating is applied by means of different ones of the patterns P1–P4 formed in the screen. For example, the second coating applied over the material M1 shown in FIG. 1 is applied by the pattern P1 in the screen 10 whilst pattern P3 in the screen 10 applies a second coating over material M2, the first coating of which was applied by the pattern P1 Thus, not only is the second coating applied by coating means travelling in a coating direction C across the screen at an orientation of 90° to that in which the first coating is applied but also the actual patterns through which the second coating is applied are different. By this means it is ensured that the risk that any pinholes will occur in the applied material is practically zero.

After all the necessary layers have been applied to the sheet material 12 individual circuit boards are severed from the sheet material 12 by a suitable means such as, for example, routing. Each of the boards carryies material applied by one of the patterns P1–P4, there being four separate boards manufactured in this method.

What we claim is:

1. A method of producing a contact pad for a printed-circuit board comprising the steps of:
   (a) printing a pattern of the contact pad in a conductive ink in a desired location on the printed-circuit board;
   (b) curing the conductive ink;
   (c) printing the pattern in a carbon ink over the cured conductive ink; and
   (d) curing the carbon ink.

2. The method of claim 1 where the steps of printing comprise screen printing the conductive ink and screen printing the carbon ink.

3. A method of manufacturing circuit boards by applying a layer in a desired pattern to a substrate for a printed circuit, the layer being such that a number of identical or substantially identical boards are printed on the substrate and subsequently separated, the boards being positioned such that the same pattern may be applied to the substrate when the substrate is presented to a pattern applying portion of a coating apparatus in any of a number of orientations each separated from the next by a fixed angle of rotation about an axis at right angles to the substrate at a centre of the substrate in one such orientation, the method comprising presenting the substrate to the pattern applying portion of the coating apparatus and applying a first coating in the desired pattern to the substrate, relatively rotating the substrate and pattern applying portion through said fixed angle (or a multiple thereof other than 360°) so that the substrate and pattern applying portion are again in register and thereafter applying a second coating in the desired pattern to the substrate.

4. A method according to claim 3 wherein the fixed angle is 180°.

5. A method according to claim 4 wherein the apparatus is a screen printing apparatus and the screen and substrate are rotated in opposite directions each through 90°.

6. A method according to claim 3 wherein the substrate is a sheet material on which the circuits are printed and from which the individual circuit boards are severed after printing.

7. A method of making a multi-layer printed circuit comprising procuring a substrate and forming conductors on a surface of said substrate and, thereafter, applying over said surface by a printing technique alternating layers of insulating material and conductive material, each of said layers being applied in a preselected pattern for that layer, the patterns of some, at least, of the insulating material layers having openings therein through which material of subsequently applied conductive material layers makes electrical contact with said conductors or with previously applied layers of conductive material at predetermined locations whereby to effect circuit connections and wherein regions of two layers of conductive material are applied with a corresponding region of a layer of insulating material disposed between said regions of two layers of conductive material whereby to provide a capacitor of said printed circuit, and further wherein the conductive material of at least one said layer of conductive material is a resistive ink which is deposited in a controlled amount to serve as a circuit resistor.

8. A method of making a multi-layer printed circuit comprising forming a pattern of conductors and insulators by printing conductive ink, and insulating material on a substrate, leaving exposed parts of said conductors to provide electrical contact or connection regions and protecting said exposed parts by over-printing them with an ink that deposits a carbon layer whereby said exposed parts remain electrically conductive.

9. A printed circuit produced on a single side of a substrate comprising a first set of electrical conductors carried on a surface of the substrate, a layer of an insulating polymer applied on a portion of said surface of the substrate and bridging a first of said electrical conductors on the surface, a bridging electrical conductor carried on the surface of said layer of insulating polymer opposite said surface of the substrate so that it is insulated from said first electrical conductor and in electrical contact with at least a second and a third of said electrical conductors on said surface at opposite sides of said first electrical conductors, a second layer of insulating polymer applied on portions of said surface but which leaves exposed parts of said first set of electrical conductors, and a second set of electrical conductors carried partly on said second layer of insulating polymer but making electrical contact with some of said first set of electrical conductors at said exposed portions, and at least one further layer of insulating polymer applied on said surface and/or on parts at least of previously applied insulating layers and conductors, which leaves exposed parts of at least one set of previously applied electrical conductors.

10. A printed circuit on a single side of a substrate comprising a set of electrical conductors carried on a surface of the substrate or on a layer of insulating polymer applied on the substrate, a layer of insulating polymer applied over said set of electrical conductors and a conducting layer applied over the second-mentioned layer of insulating polymer as a shield against radio-frequency interference or as a ground plane to provide electrical isolation of portions of a circuit from each other.

11. A printed circuit on a substrate comprising at least one set of electrical conductors carried on a surface of the substrate, a layer of an insulating polymer applied on a portion of said surface and bridging a first electrical conductor, a bridging electrical conductor carried on the surface of said bridging layer of insulating polymer so that it is insulated from said first electrical conductor but in electrical contact with at least a second electrical conductor and a third electrical conductor at opposite sides of said first electrical conductor, resistors formed by depositing a controlled amount of resistive ink and capacitors produced by printing conductive layers separated by insulating layers.

12. A multi-layer printed circuit comprising a pattern of conductors and insulators on a substrate with parts of said conductors exposed to provide electrical contact or connection regions, said exposed parts being covered by a carbon layer to protect the exposed parts but ensuring that the exposed parts remain electrically conductive.

* * * * *